US012563837B2

(12) United States Patent
Hu et al.

(10) Patent No.: US 12,563,837 B2
(45) Date of Patent: Feb. 24, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Junyan Hu, Hubei (CN); Chao Dai, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 431 days.

(21) Appl. No.: 18/043,340

(22) PCT Filed: Aug. 30, 2022

(86) PCT No.: PCT/CN2022/115996
§ 371 (c)(1),
(2) Date: Feb. 28, 2023

(87) PCT Pub. No.: WO2024/000788
PCT Pub. Date: Jan. 4, 2024

(65) Prior Publication Data
US 2024/0297184 A1 Sep. 5, 2024

(30) Foreign Application Priority Data
Jul. 1, 2022 (CN) .......................... 202210773811.X

(51) Int. Cl.
| | |
|---|---|
| *H10D 86/60* | (2025.01) |
| *G09G 3/3233* | (2016.01) |
| *H10D 30/67* | (2025.01) |
| *H10D 86/40* | (2025.01) |

(52) U.S. Cl.
CPC ........... *H10D 86/60* (2025.01); *G09G 3/3233* (2013.01); *H10D 30/6723* (2025.01);
(Continued)

(58) Field of Classification Search
CPC ... H10D 86/60; H10D 30/6723; G09G 3/3233
See application file for complete search history.

(56) References Cited

U.S. PATENT DOCUMENTS

2017/0345845 A1* 11/2017 Wu .................... G02F 1/136286
2018/0151125 A1* 5/2018 Lee ....................... G09G 3/3266
(Continued)

FOREIGN PATENT DOCUMENTS

| CN | 103941507 A | 7/2014 |
|---|---|---|
| CN | 105807523 A | 7/2016 |

(Continued)

OTHER PUBLICATIONS

International Search Report in International application No. PCT/CN2022/115996,mailed on Mar. 17, 2023.
(Continued)

*Primary Examiner* — Yara B Green
*Assistant Examiner* — Coralie A Nettles
(74) *Attorney, Agent, or Firm* — PV IP PC; Christopher S. Ruprecht; Wei Te Chung

(57) ABSTRACT

The present application provides a display panel and a display device. In the display panel, by disposing at least a part of at least one of the reset signal line and the low-potential signal line in the gate driving circuit area, an area of at least the part of the gate driving circuit area occupied by the reset signal line and the low-potential signal line can be reduced, so that a width of a border required for the part is reduced, thereby reducing the border of the display panel.

13 Claims, 6 Drawing Sheets

(52) U.S. Cl.
  CPC ....... *H10D 30/6755* (2025.01); *H10D 86/423*
    (2025.01); *H10D 86/443* (2025.01); *H10D*
    *86/451* (2025.01); *H10D 86/481* (2025.01);
    *G09G 2300/0426* (2013.01); *G09G 2300/0842*
    (2013.01)

(56) References Cited

U.S. PATENT DOCUMENTS

| 2019/0348491 | A1* | 11/2019 | Chung | ............... | H10K 59/1213 |
| 2023/0255059 | A1* | 8/2023 | Na | ..................... | H10K 59/1213 |
| | | | | | 257/40 |

FOREIGN PATENT DOCUMENTS

| CN | 109256395 | A | 1/2019 |
| CN | 110047880 | A | 7/2019 |
| CN | 113096573 | A | 7/2021 |
| CN | 113192988 | A | 7/2021 |
| CN | 114284317 | A | 4/2022 |
| CN | 114613789 | A | 6/2022 |

OTHER PUBLICATIONS

Written Opinion of the International Search Authority in International application No. PCT/CN2022/115996,mailed on Mar. 17, 2023.
Chinese Office Action issued in corresponding Chinese Patent Application No. 202210773811.X dated Oct. 23, 2024, pp. 1-7.

* cited by examiner (a)

(b)

34

DISPLAY PANEL AND DISPLAY DEVICE

BACKGROUND OF INVENTION

Field of Invention

The present application relates to the field of display technology, and in particular, to a display panel and a display device.

Description of Prior Art

In order to realize a narrow border in the existing display device, a gate driving circuit is extended to a display area, and a light-emitting unit is arranged on the gate driving circuit to compress the pixel unit, thereby reducing the border. However, this method is only suitable for display devices with lower resolution. As resolution increases, a pixel size cannot be further compressed, resulting in a still large border of the display device. Furthermore, in this process, multiple line changes are required to realize the control of the light-emitting unit, resulting in complicated processes and a low yield. In addition, in order to reduce power consumption of the display panel, low temperature poly-oxide (LTPO) technology will be used, which will further increase a difficulty of the process and reduce the yield.

Therefore, the existing display device has a technical problem that disposing the light-emitting unit on the gate driving circuit will lead to a low yield of the display device.

SUMMARY OF INVENTION

Embodiments of the present application provide a display panel and a display device, so as to alleviate the technical problem of the existing display device that disposing the light-emitting unit on the gate driving circuit will lead to low yield of the display device.

In order to solve the above-mentioned problems, the technical solutions provided by the present application are as follows.

An embodiment of the present application provides a display panel, and the display panel includes:

a display area provided with a pixel light-emitting unit and a pixel driving circuit configured to control the pixel light-emitting unit;

a non-display area defined at a periphery of the display area, wherein the non-display area includes a gate driving circuit area, and the non-display area is provided with a reset signal line and a low-potential signal line;

wherein the reset signal line is connected to the pixel driving circuit, the low-potential signal line is connected to the pixel light-emitting unit, the gate driving circuit area is provided with a gate driving circuit, at least a part of at least one of the reset signal line and the low-potential signal line is disposed in the gate driving circuit area, and the reset signal line and the low-potential signal line are insulated from the gate driving circuit.

In some embodiments, the gate driving circuit includes a plurality of metal layers, and at least part of the reset signal line and the low-potential signal line is disposed in a different layer from any one of the metal layers in the gate driving circuit.

In some embodiments, the display panel includes:

a substrate;

a semiconductor layer disposed on a side of the substrate;

a first metal layer disposed on a side of the semiconductor layer away from the substrate;

a second metal layer disposed on a side of the first metal layer away from the semiconductor layer;

a first source-drain layer disposed on a side of the second metal layer away from the first metal layer; and a second source-drain layer disposed on the side of the first source-drain layer away from the second metal layer;

wherein, the gate driving circuit includes a transistor and a capacitor, the transistor includes a gate, a source, and a drain, the capacitor includes a capacitor plate, the gate is disposed in the first metal layer, and the capacitor plate is disposed in the second metal layer, the source and the drain are disposed in the first source-drain layer, and at least part of the reset signal line and the low-potential signal line is disposed in a different layer from a metal located in the first metal layer, the second metal layer, the first source-drain layer, and the second source-drain layer in the gate driving circuit.

In some embodiments, the display panel further includes a third source-drain layer, a first planarization layer, and a second planarization layer, the third source-drain layer is disposed on a side of the second source-drain layer away from the first source-drain layer, the first planarization layer is disposed between the first source-drain layer and the second source-drain layer, the second planarization layer is disposed between the second source-drain layer and the third source-drain layer; at least one of the reset signal line and the low-potential signal line includes a first overlapping portion disposed in the third source-drain layer, and a projection of the first overlapping portion on the substrate overlaps a projection of the gate driving circuit on the substrate.

In some embodiments, the reset signal line is disposed in the third source-drain layer, and a projection of the reset signal line on the substrate overlaps the projection of the gate driving circuit on the substrate.

In some embodiments, the projection of the reset signal line on the substrate overlaps a projection of the source on the substrate, or the projection of the reset signal line on the substrate overlaps a projection of the drain on the substrate, or the projection of the reset signal line on the substrate overlaps a projection of the gate on the substrate, or the projection of the reset signal line on the substrate overlaps a projection of the capacitor plate on the substrate.

In some embodiments, the pixel driving circuit includes a first reset transistor and a second reset transistor, the second source-drain layer includes a connection metal, and the reset signal line is connected to the connection metal through a via hole penetrating through the second planarization layer, the connection metal extends from the gate driving circuit area to the display area and is connected to the first reset transistor and the second reset transistor.

In some embodiments, the low-potential signal line is disposed in the third source-drain layer, and a projection of the low-potential signal line on the substrate overlaps the projection of the gate driving circuit on the substrate.

In some embodiments, the low-potential signal line includes a first portion, a second portion and a third portion, the first portion is disposed in the first source-drain layer, the second portion is disposed in the second source-drain layer, the third portion is disposed in the third source-drain layer, and the second portion is connected to the first portion through a via hole penetrating through the first planarization layer, the third portion is connected to the second portion through the via hole penetrating through the second planarization layer, a projection of the third portion on the substrate overlaps the projection of the gate driving circuit on the substrate, a width of the third portion is greater than a width of the first portion, and the width of the third portion is greater than a width of the second portion.

In some embodiments, the display panel further includes a fourth source-drain layer, the fourth source-drain layer is disposed on a side of the third source-drain layer away from the second source-drain layer, the reset signal line is disposed in the fourth source-drain layer, and the projection of the reset signal line on the substrate overlaps the projection of the third portion on the substrate.

In some embodiments, the display panel further includes a light-shielding layer disposed between the substrate and the semiconductor layer, at least one of the reset signal line and the low-potential signal line includes a second overlapping portion disposed in the light-shielding layer, and a projection of the second overlapping portion on the substrate overlaps the projection of the gate driving circuit on the substrate.

In some embodiments, the reset signal line is disposed in the light-shielding layer, and the projection of the reset signal line on the substrate overlaps the projection of the gate driving circuit on the substrate.

In some embodiments, the low-potential signal line includes a first portion, a second portion, and a fourth portion, the first portion is disposed in the first source-drain layer, the second portion is disposed in the second source-drain layer, and the fourth portion is disposed in the light-shielding layer;

wherein the display panel further includes a first insulating layer, a second insulating layer, a third insulating layer, a fourth insulating layer, a fifth insulating layer, an active layer, and a third metal layer, and the first insulating layer is disposed between the semiconductor layer and the first metal layer, the second insulating layer is disposed between the first metal layer and the second metal layer, the third insulating layer is disposed between the second metal layer and the active layer, the fourth insulating layer is disposed between the active layer and the third metal layer, and the fifth insulating layer is disposed between the third metal layer and the source-drain layer; and wherein the second portion is connected to the first portion through the via hole of the first planarization layer, the first portion is connected to the fourth portion through a via hole penetrating through the first insulating layer, the second insulating layer, the third insulating layer, the fourth insulating layer, and the fifth insulating layer, a projection of the fourth portion on the substrate overlaps the projection of the gate driving circuit on the substrate, and a width of the fourth portion is greater than the width of the first portion, and the width of the fourth portion is greater than the width of the second portion.

Meanwhile, an embodiment of the present application provides a display device, the display device includes a display panel and a driver chip, and the display panel includes:

a display area provided with a pixel light-emitting unit and a pixel driving circuit configured to control the pixel light-emitting unit;

a non-display area defined at a periphery of the display area, wherein the non-display area includes a gate driving circuit area, and the non-display area is provided with a reset signal line and a low-potential signal line;

wherein the reset signal line is connected to the pixel driving circuit, the low-potential signal line is connected to the pixel light-emitting unit, the gate driving circuit area is provided with a gate driving circuit, at least a part of at least one of the reset signal line and the low-potential signal line is disposed in the gate driving circuit area, and the reset signal line and the low-potential signal line are insulated from the gate driving circuit.

In some embodiments, the gate driving circuit includes a plurality of metal layers, and at least part of the reset signal line and the low-potential signal line is disposed a different layer from in any one of the metal layers in the gate driving circuit.

In some embodiments, the display panel includes:

a substrate;

a semiconductor layer disposed on a side of the substrate;

a first metal layer disposed on a side of the semiconductor layer away from the substrate;

a second metal layer disposed on a side of the first metal layer away from the semiconductor layer;

a first source-drain layer disposed on a side of the second metal layer away from the first metal layer; and a second source-drain layer disposed on the side of the first source-drain layer away from the second metal layer;

wherein, the gate driving circuit includes a transistor and a capacitor, the transistor includes a gate, a source, and a drain, the capacitor includes a capacitor plate, the gate is disposed in the first metal layer, and the capacitor plate is disposed in the second metal layer, the source and the drain are disposed in the first source-drain layer, and at least part of the reset signal line and the low-potential signal line is disposed in different layer from a metal located in the first metal layer, the second metal layer, the first source-drain layer, and the second source-drain layer in the gate driving circuit.

In some embodiments, the display panel further includes a third source-drain layer, a first planarization layer, and a second planarization layer, the third source-drain layer is disposed on a side of the second source-drain layer away from the first source-drain layer, the first planarization layer is disposed between the first source-drain layer and the second source-drain layer, the second planarization layer is disposed between the second source-drain layer and the third source-drain layer; at least one of the reset signal line and the low-potential signal line includes a first overlapping portion disposed in the third source-drain layer, and a projection of the first overlapping portion on the substrate overlaps a projection of the gate driving circuit on the substrate.

In some embodiments, the reset signal line is disposed in the third source-drain layer, and a projection of the reset signal line on the substrate overlaps the projection of the gate driving circuit on the substrate.

In some embodiments, the projection of the reset signal line on the substrate overlaps a projection of the source on the substrate, or the projection of the reset signal line on the substrate overlaps a projection of the drain on the substrate, or the projection of the reset signal line on the substrate overlaps a projection of the gate on the substrate, or the projection of the reset signal line on the substrate overlaps a projection of the capacitor plate on the substrate.

In some embodiments, the pixel driving circuit includes a first reset transistor and a second reset transistor, the second source-drain layer includes a connection metal, and the reset signal line is connected to the connection metal through a via hole penetrating through the second planarization layer, the connection metal extends from the gate driving circuit area to the display area and is connected to the first reset transistor and the second reset transistor.

The present application provides a display panel and a display device; the display panel includes a display area and a non-display area, the display area is provided with a pixel light-emitting unit and a pixel driving circuit for controlling the pixel light-emitting unit, the non-display area is defined at a periphery of the display area, and the non-display area is defined at a periphery of the display area, wherein the non-display area includes a gate driving circuit area, and the non-display area is provided with a reset signal line and a low-potential signal line; wherein the reset signal line is connected to the pixel driving circuit, the low-potential signal line is connected to the pixel light-emitting unit, the gate driving circuit area is provided with a gate driving circuit, at least a part of at least one of the reset signal line and the low-potential signal line is disposed in the gate driving circuit area, and the reset signal line and the low-potential signal line are insulated from the gate driving circuit. In the present application, by disposing at least a part of at least one of the reset signal line and the low-potential signal line in the gate driving circuit area, an area of at least the part of the gate driving circuit area occupied by the reset signal line and the low-potential signal line can be reduced, so that a width of a border required for the part is reduced, thereby reducing the border of the display panel. In addition, this approach does not need to dispose the gate driving circuit on the light-emitting unit, thus reducing the technological difficulty of manufacturing the display panel, and improving the yield of the display panel.

DETAILED DESCRIPTION OF PREFERRED EMBODIMENTS

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

The embodiments of the present application provide a display panel and a display device to alleviate the technical problem of the existing display device that disposing the light-emitting unit on the gate driving circuit will lead to a low yield of the display device.

Figure 1:
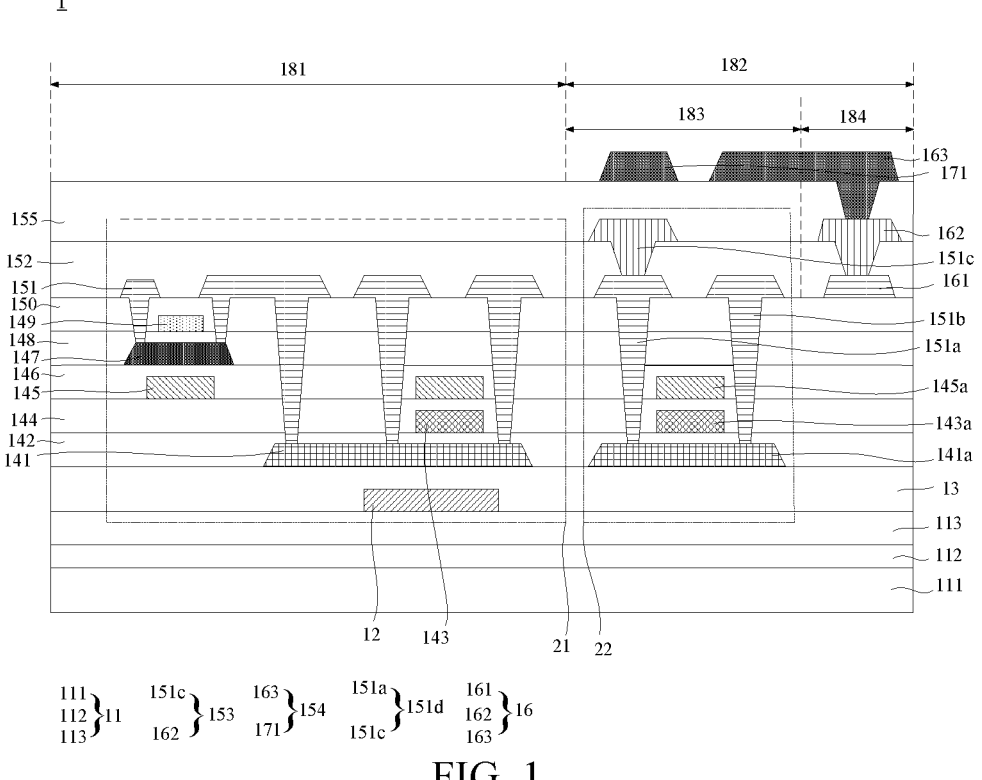
FIG. 1 is a first schematic diagram of a display panel provided by an embodiment of the present application.
Figure 2:
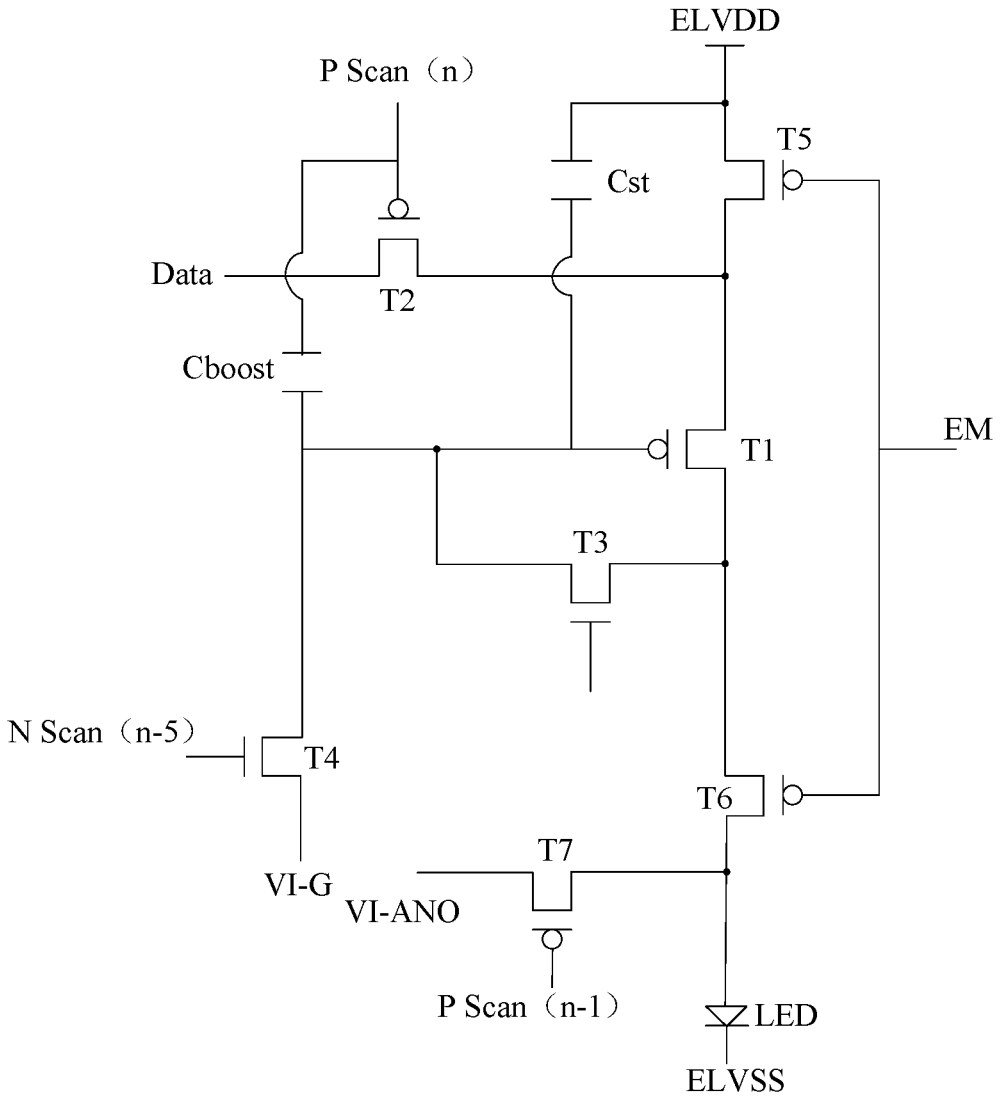
FIG. 2 is a circuit diagram of a display panel provided by an embodiment of the present application.

As shown in FIG. 1 and FIG. 2, an embodiment of the present application provides a display panel. The display panel 1 includes:

a display area 181 provided with a pixel light-emitting unit LED and a pixel driving circuit 21 configured to control the pixel light-emitting unit LED;

a non-display area 182 defined at a periphery of the display area 181, wherein the non-display area 182 includes a gate driving circuit area 183, and the non-display area 182 is provided with a reset signal line 171 and a low-potential signal line 16;

The reset signal line 171 is connected to the pixel driving circuit 21, the low-potential signal line 16 is connected to the pixel light-emitting unit LED, and the gate driving circuit area 183 is provided with the gate driving circuit 22, at least a part of at least one of the reset signal line 171 and the low-potential signal line 16 is disposed in the gate driving circuit area 183, and the reset signal line 171 and the low-potential signal line 16 are insulated from the gate driving circuit 22.

An embodiment of the present application provides a display panel. In the display panel, by disposing at least a part of at least one of the reset signal line and the low-potential signal line in the gate driving circuit area, an area of at least the part of the gate driving circuit area occupied by the reset signal line and the low-potential signal line can be reduced, so that a width of a border required for the part is reduced, thereby reducing the border of the display panel. In addition, this solution does not need to set the gate driving circuit on the light-emitting unit, reduces the technological difficulty of manufacturing the display panel, and improves yield of the display panel.

It should be noted that FIG. 1 is a cross-sectional view of a display panel. Therefore, all components of a single sub-pixel are not shown in FIG. 1, but only some transistors, wirings and capacitors are shown. Therefore, it is appreciated that the pixel driving circuit in FIG. 1 includes not only two transistors, but also other components. Similarly, the gate driving circuit shown in FIG. 1 includes not only a single transistor, but also other components. Specifically, the components included in the pixel driving circuit may be multiple components shown in the circuit in FIG. 2.

It should be noted that, in the cross-sectional view shown in FIG. 1, the low-potential signal line is marked with a reference numeral 16, and in the circuit diagram shown in FIG. 2, the low-potential signal line is marked with ELVSS, which is only different markings adopted in different drawings. In fact, the low-potential signal line in the cross-sectional view shown in FIG. 1 corresponds to the low-potential signal line in the circuit diagram shown in FIG. 2. Similarly, components with different markings in other cross-sectional views and circuit diagrams also refer to the same component, which will not be repeated herein for brevity.

It should be noted that projections of the reset signal line and the low-potential signal line on a plane where the gate driving circuit is located refers to projections of the reset signal line and the low-potential signal line on a plane where any one of the metal layers in the gate driving circuit is located. Taking the gate driving circuit including a metal of the gate layer as an example, the projection can be the projection of the reset signal line and the low-potential signal line on the gate layer, the projection is located in the gate driving circuit area, and the reset signal line and the low-potential signal line are insulated from the gate driving circuit, that is, a part of at least one of the reset signal line and the low-potential signal line is arranged in the gate driving circuit area, and the projection of the reset signal line and the low-potential signal line overlaps with the projection of the gate driving circuit, that is, an area of at least one of the reset signal line and the low-potential signal line occupying the width of the border is reduced, thus reducing the border of the display panel.

It should be noted that although the pixel light-emitting unit is indicated by LED, the present application does not particularly limit the pixel light-emitting unit to be a light-emitting diode, and the pixel light-emitting unit may be an organic light-emitting diode.

In one embodiment, the gate driving circuit includes a transistor, the pixel driving circuit includes a connection wire, the reset signal line is connected to the pixel driving circuit through the connection wire, and at least part of the connection wire is disposed in one of the metal layers where the transistor is located. As such, by disposing at least part of the connection wire in one of the metal layers where the transistor is located, there is no need to add a metal layer for the connection wire, preventing an increase of the thickness of the display panel.

In one embodiment, the pixel driving circuit includes a connection wire, the reset signal line is connected to the pixel driving circuit through the connection wire, and the connection wire extends from the gate driving circuit area to the display area, the connection wire and the reset signal line are arranged in the same metal layer. By arranging the connection wire and the reset signal line in the same layer, there is no need to add a metal layer when forming the connection wire, thus preventing the increase of the thickness of the display panel, and the connection wire and the reset signal line can be formed at the same time by etching, thus preventing the increase of the process difficulty.

In one embodiment, the display panel includes a connection hole, the connection hole is defined in the display area, the connection hole is located on the pixel driving circuit, and the connection wire passes through the connection hole. By arranging the connection holes in the display area and on the pixel driving circuit, the connection wires are formed of the same metal layer as the reset signal line, so that the connection wire can be directly connected to the pixel driving circuit through the connection hole without modifying a location of the connection hole, thereby reducing the process complexity.

In one embodiment, the gate driving circuit includes a plurality of metal layers, and at least part of the reset signal line and the low-potential signal line is disposed in a different layer from any one of the metal layers in the gate driving circuit. By arranging the reset signal line and the low-potential signal line and any metal in a different layer from any one of the metal layers in the gate driving circuit, when the reset signal line and the low-potential signal line are arranged in the gate driving circuit area to reduce the border, the reset signal line and the low-potential signal line are not disposed in the layer where the gate driving circuit is located, so that the reset signal line and the low-potential signal line can be prevented from short-circuiting or interfering with the metal in the gate driving circuit.

In order to solve problems that a free space of each layer in the gate driving circuit is small and disposing the reset signal line or the low-potential signal line may cause signal interference or short circuit, in one embodiment, as shown in FIG. 1, the display panel 1 includes:

a substrate 11;

a semiconductor layer 141 disposed on one side of the substrate 11;

a first metal layer 143 disposed on a side of the semiconductor layer 141 away from the substrate 11;

a second metal layer 145 disposed on a side of the first metal layer 143 away from the semiconductor layer 141;

a first source-drain layer 151 disposed on a side of the second metal layer 145 away from the first metal layer 143;

a second source-drain layer 153 disposed on a side of the first source-drain layer 151 away from the second metal layer 145;

The gate driving circuit 22 includes a transistor and a capacitor, the transistor includes a gate 143a, a source 151d, and a drain 151b, the capacitor includes a capacitor plate 145a, and the gate 143a is disposed in the first metal layer 143, the capacitor plate 145a is disposed in the second metal layer 145, the source 151d and the drain 151b are disposed on the first source-drain layer 151, at least part of the reset signal line 171 and the low-potential signal line 16 is disposed in a different layer from a metal located in the first metal layer 143, the second metal layer 145, the first source-drain layer 151, and the second source-drain layer 153 in the gate driving circuit 22.

Taking the display panel shown in FIG. 1 as an example, it can be seen from FIG. 1 that the reset signal line 171 and the low-potential signal line 16 are disposed in a different layer from a metal located in the gate driving circuit 22, so that when the reset signal line and the low-potential signal line are arranged in the gate driving circuit area to reduce the border, the reset signal line and the low-potential signal line are not disposed in the layer where the gate driving circuit is located, thereby preventing the reset signal line and the low-potential signal line from short-circuiting or interfering with the metal in the gate driving circuit.

Specifically, it can be seen from FIG. 1 that the gate driving circuit includes a transistor and a capacitor, the transistor includes a gate, a source, and a drain, and the capacitor includes a capacitor plate. Therefore, when part of the reset signal line and the low-potential signal line arranged in the gate driving circuit is arranged in the layer where these components are located, it will cause short circuit or interference. In this embodiment of the present application, the reset signal line and the low-potential signal line are arranged in other layers to prevent the reset signal line and the low-potential signal line from short-circuiting or interfering with the metal in the gate driving circuit to result in poor signal.

It should be noted that, in the embodiments of the present application, only the part of the reset signal line and the low-potential signal line in the gate driving circuit area are limited to be disposed in a different layer from the metal in the gate driving circuit; while for another part of the reset signal line and the low-potential signal line and the low-potential signal line outside the gate driving circuit area is not particularly limited. For example, it can be seen from FIG. 1 that the low-potential signal line also includes a part disposed on the first source-drain layer.

In view of the problem that the reset signal line or the low-potential signal line is disposed in the layer where the metal is located in the gate driving circuit, which may cause signal interference or short circuit, in an embodiment, as shown in FIG. 1, the display panel 1 further includes a third source-drain layer 154, a first planarization layer 152, and a second planarization layer 155, the third source-drain layer 154 is disposed on a side of the second source-drain layer 153 away from the first source-drain layer 151, the first planarization layer 152 is disposed between the first source-drain layer 151 and the second source-drain layer 153, and the second planarization layer 155 is disposed between the second source-drain layer 153 and the third source-drain layer 154. At least one of the reset signal line 171 and the low-potential signal line 16 includes a first overlapping portion disposed in the third source-drain layer 154, and a projection of the first overlapping portion on the substrate 11 overlaps a projection of the gate driving circuit 22 on the substrate 11. By adding a third source-drain layer, the reset signal line and the low-potential signal line can be arranged in the third source-drain layer, and will not be arranged in the same layer as the metal of the gate driving circuit, thus preventing a metal (such as the gate) in the gate driving circuit from interfering or short-circuiting with the reset signal line and the low-potential signal line to result in an error in the signal transmission of the gate driving circuit and the pixel driving circuit. In addition, the reset signal line and the low-potential signal line are formed by the newly added third source-drain layer, so that widths of the reset signal line and the low-potential signal line can be increased, and impedance of the reset signal line and the low-potential signal line can be reduced.

Specifically, the first overlapping portion refers to the part of the reset signal line and the low-potential signal line in the gate driving circuit area. Taking FIG. 1 as an example, each part of the reset signal line is located in the gate driving circuit area, and thus the first overlapping portion of the reset signal line refers to the entire reset signal line; while only part of the low-potential signal line is located in the gate driving circuit area, and thus the first overlapping portion of the low-potential signal line refers to the part of the third portion 163 of the low-potential signal line located in the gate driving circuit area.

In view of a problem of a relatively large border of the display panel caused by disposing the reset signal lines in the second source-drain layer, in an embodiment, as shown in FIG. 1, the reset signal line 171 is disposed in the third source-drain layer 154, and the projection of the reset signal line 171 on the substrate 11 overlaps the projection of the gate driving circuit 22 on the substrate 11. By arranging the reset signal lines in the third source-drain layer, the width of the border can be reduced, and in this process, the metal of the third source-drain layer is connected to the second source-drain layer and other metal layers through via holes, which does not cause process risks, thus improving the yield of display panels.

Specifically, since the width of the reset signal line is small, the reset signal line can be entirely disposed on the gate driving circuit, thereby eliminating the width of the border occupied by the reset signal line and reducing the border of the display panel.

In some embodiments, the projection of the reset signal line on the substrate overlaps a projection of the source on the substrate, or the projection of the reset signal line on the substrate overlaps a projection of the drain on the substrate, or the projection of the reset signal line on the substrate overlaps a projection of the gate on the substrate, or the projection of the reset signal line on the substrate overlaps a projection of the capacitor plate on the substrate. When the reset signal line is disposed in the third source-drain layer, since the width of the reset signal line is small, it does not need to occupy all the area of the gate driving circuit area, and the projection of the reset signal line can overlap the projections of the source, the drain, the gate, and the capacitor plate on the substrate, so that the reset signal line is located in the area where the gate driving circuit is located, and there is no need to set a border area corresponding to the reset signal line, thereby reducing the border of the display panel.

Specifically, the projection of the reset signal line on the substrate overlaps the projection of the gate on the substrate, and in view of the problem of parasitic capacitance between the third source-drain layer provided for the reset signal line and the metal of the second source-drain layer, the projection of the reset signal line on the substrate can be overlapped with the projection of the gate on the substrate. Since a distance between the reset signal line and the layer where the gate is located is large, the possibility of generation of the parasitic capacitance can be reduced, thereby preventing the interference of the signal caused by parasitic capacitance between the reset signal line and other metals.

In one embodiment, the pixel driving circuit includes a first reset transistor and a second reset transistor, the first source-drain layer includes a connection metal, and the reset signal line passes through the second planarization layer. The via hole is connected to a connection metal extending from the gate driving circuit area to the display area and connected with the first reset transistor and the second reset transistor. By forming the connection metal in the first source-drain layer, the connection metal can connect the reset signal line and the first reset transistor and the second reset transistor, so that the normal operation of the reset signal line is realized.

Specifically, when the reset signal line is arranged in the third source-drain layer, the reset signal line can be connected to the second source-drain layer in the gate driving circuit area, and then the reset signal line can pass through the second source-drain layer. The connection metal extends to the display area, and is connected with the source and drain of the first reset transistor and the second reset transistor in the display area, so as to realize the signal input to the first reset transistor and the second reset transistor.

In an embodiment, as shown in FIG. 2, the reset signal line includes a first reset signal line VI-G and a second reset signal line VI-ANO, at least one of the first reset signal line VI-G and the second reset signal line VI-ANO is disposed in the third source-drain layer, and the projection of the part of the first reset signal line VI-G and the second reset signal line VI-ANO disposed in the third source-drain layer on the substrate overlaps with the projection of the gate driving circuit on the substrate.

In a display panel with a plurality of reset signal lines, each of the reset signal lines can be arranged in the third source-drain layer, and each of the reset signal lines can be arranged in the gate driving circuit area, so as to reduce the width of the border occupied by each of the reset signal lines.

In view of a problem of a large border of the display panel caused by disposing the low-potential signal lines in the first source-drain layer and the second source-drain layer, in one embodiment, the low-potential signal line is disposed in the third source-drain layer, and a projection of the low-potential signal line on the substrate overlaps the projection of the gate driving circuit on the substrate. By arranging the low-potential signal lines in the third source-drain layer, the width of the border occupied by the low-potential signal lines can be reduced, thereby reducing the border of the display panel, and impedance of the low-potential signal line can be reduced through the third source-drain layer, thereby further reducing the border of the display panel.

In view of the problem of a large width of the low-potential signal line resulting in a large width of the border occupied by the low-potential signal line, in an embodiment, as shown in FIG. 1, the low-potential signal line 16 includes a first portion 161, a second portion 162, and a third portion 163, The first portion 161 is disposed in the first source-drain layer 151, the second portion 162 is disposed in the second source-drain layer 153, the third portion 163 is disposed in the third source-drain layer 154. The second portion 162 is connected to the first portion 161 through a via hole penetrating through the first planarization layer 152, the third portion 163 is connected to the second portion 162 through the via hole penetrating through the second planarization layer 155, a projection of the third portion 163 on the substrate 11 overlaps the projection of the gate driving circuit 22 on the substrate 11, a width of the third portion 163 is greater than a width of the first portion 161, and the width of the third portion 163 is greater than a width of the second portion 162.

By arranging the low-potential signal line as the first portion, the second portion and the third portion, the signal can be transmitted to the display area through the connected first portion, second portion, and third portion, so that the low-potential signal line operates normally. In addition, the third portion is arranged in the third source-drain layer, and the projection of the third portion on the substrate overlaps the projection of the gate driving circuit on the substrate, so the width of the border occupied by the third portion can be reduced. Further, since the third portion extends from the low-potential signal line area where the first portion and the second portion are located to the gate driving circuit area, the width of the third portion is relatively large, which reduces the impedance of the low-potential signal line. In addition, the third portion is connected in parallel with the second portion, and the second portion is connected in parallel with the first portion, which further reduces the impedance of the low-potential signal line, so that the impedance of the low-potential signal line meets the driving requirements and even reduces the impedance of the low-potential signal line, thereby reducing the widths of the first portion and the second portion, reducing the width of the border occupied by the low-potential signal line, and reducing the width of the border of the display panel.

Specifically, as shown in FIG. 1, the non-display area 182 further includes a low-potential signal line area 184, the first portion 161 and the second portion 162 arranged in the low-potential signal line area 184, and the third portion 163 extends from the low-potential signal line area 184 to the gate driving circuit area 183, thereby reducing the width of the border of the display panel.

The above embodiments have been described in detail by taking the reset signal line and the low-potential signal line arranged in the third source-drain layer as an example, and it is appreciated that the reset signal line and the low-potential signal line can be arranged in the third source-drain layer at the same time to further reduce the border of the display panel, and in this case, the reset signal line and the low-potential signal line only need to be insulated from each other, and the reset signal line and the low-potential signal line can be set as described in the above embodiment, which will not be repeated herein for brevity.

In view of the problem of a larger border caused by disposing the reset signal line and the low-potential signal line in the third source-drain layer, in one embodiment, the display panel further includes a fourth source-drain layer, the fourth source-drain layer is disposed on a side of the third source-drain layer away from the second source-drain layer, the reset signal line is disposed in the fourth source-drain layer, and the projection of the reset signal line on the substrate overlaps with the projection of the third portion on the substrate. By arranging the reset signal line in the fourth source-drain layer, the third portion of the low-potential signal line can be arranged in all areas of the gate driving circuit, thereby further reducing the width of the border occupied by the low-potential signal line, and the reset signal line is arranged in the fourth source-drain layer, which can also reduce the width of the border occupied by the reset signal line, so that the border of the display panel does not need an area for arranging the reset signal line, and the width of an area for arranging the low-potential signal line is small, thus further reducing the border of the display panel.

Specifically, when the reset signal line is arranged in the fourth source-drain layer, connection metal can be arranged in the third source-drain layer and the second source-drain layer respectively, so that the reset signal line is connected to the connection metal of the third source-drain layer and then connected to the connection metal of the second source-drain layer. In addition, by extending the connection metal to the display area to connect with the sources and drains of the first reset transistor and the second reset transistor, signal input to the first reset transistor and the second reset transistor is realized.

Figure 3:
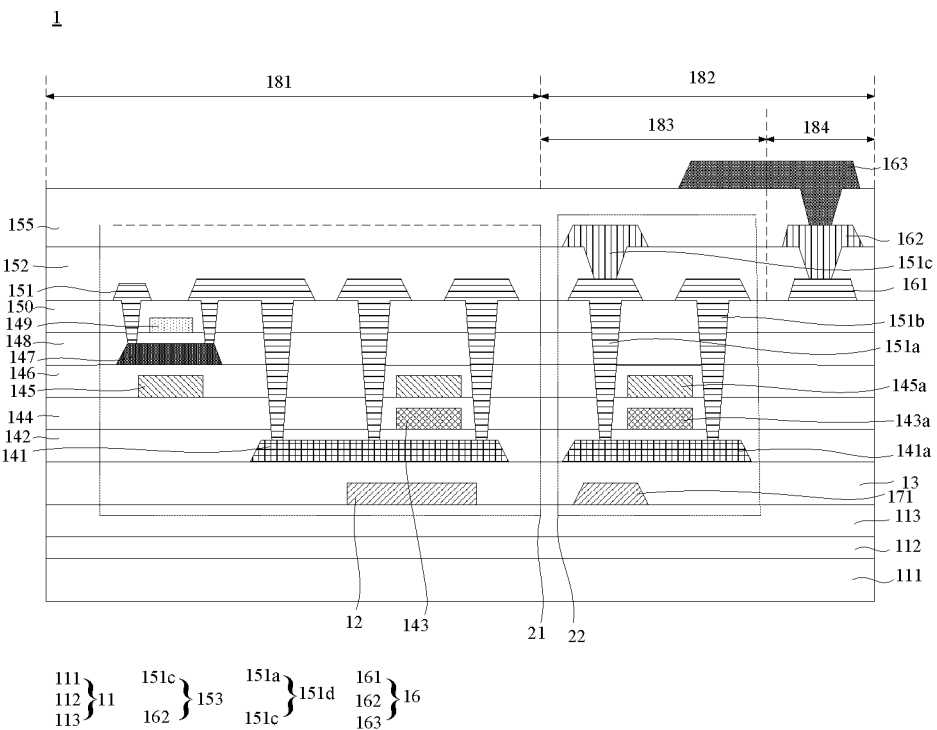
FIG. 3 is a second schematic diagram of a display panel according to an embodiment of the present application.

In view of the problem of a relatively large thickness of the display panel caused by disposing the reset signal line and the low-potential signal line in the newly added layer, in an embodiment, as shown in FIG. 3, the display panel 1 further includes a light-shielding layer 12, the light-shielding layer 12 is disposed between the substrate 11 and the semiconductor layer 141, at least one of the reset signal line 171 and the low-potential signal lines 16 includes a second overlapping portion provided in the light-shielding layer 12, and the projection of the second overlapping portion on the substrate 11 overlaps the projection of the gate driving circuit 22 on the substrate 11. By arranging at least one of the reset signal line and the low-potential signal line in the light-shielding layer, a space occupied by the reset signal line and the low-potential signal line can be reduced, the border of the display panel can be reduced, and the reset signal line and the low-potential signal line are not disposed in the same layer as the metal of gate driving circuit, so as to prevent a metal (such as the gate) in the gate driving circuit from interfering or short-circuiting with the reset signal line and the low-potential signal line to result in an error in the signal transmission of the gate driving circuit and the pixel driving circuit. In addition, the reset signal line and the low-potential signal line are formed by the newly added third source-drain layer, so that widths of the reset signal line and the low-potential signal line can be increased, and impedance of the reset signal line and the low-potential signal line can be reduced.

Specifically, the second overlapping portion refers to the portion of the reset signal line and the low-potential signal line in the gate driving circuit area. Taking FIG. 3 as an example, each part of the reset signal line is located in the gate driving circuit area, and thus the second overlapping portion of the reset signal line refers to the entire reset signal line. Similarly, the second overlapping portion of the low-potential signal line refers to the portion of the low-potential signal line in the gate driving circuit area.

In an embodiment, as shown in FIG. 3, the reset signal line 171 is disposed in the light-shielding layer 12, and the projection of the reset signal line 171 on the substrate 11 overlaps the projection of the gate driving circuit 22 on the substrate 11. By arranging the reset signal line in the light-shielding layer, the width of the border occupied by the reset signal line can be reduced, thereby reducing the border of the display panel, and the thickness of the display panel is not increased because no additional layer is required.

Specifically, when the reset signal line is disposed in the light-shielding layer, the second source-drain layer can be formed into the connection metal, and the connection metal can penetrate each of the insulating layer and the planarization layer to connect to the reset signal line. In addition, the connection metal is extended to the display area and then connected to the first reset transistor and the second reset transistor, enabling signal input to the first reset transistor and the second reset transistor.

In an embodiment, the low-potential signal line includes a first portion, a second portion, and a fourth portion, the first portion is disposed in the first source-drain layer, and the second portion is disposed in the second source-drain layer, and the fourth portion is disposed in the light-shielding layer.

The display panel further includes a first insulating layer, a second insulating layer, a third insulating layer, a fourth insulating layer, a fifth insulating layer, an active layer, and a third metal layer, and the first insulating layer is disposed between the semiconductor layer and the first metal layer, the second insulating layer is disposed between the first metal layer and the second metal layer, the third insulating layer is disposed between the second metal layer and the active layer, the fourth insulating layer is disposed between the active layer and the third metal layer, and the fifth insulating layer is disposed between the third metal layer and the source-drain layer; and The second portion is connected to the first portion through the via hole of the first planarization layer, the first portion is connected to the fourth portion through a via hole penetrating through the first insulating layer, the second insulating layer, the third insulating layer, the fourth insulating layer, and the fifth insulating layer, a projection of the fourth portion on the substrate overlaps the projection of the gate driving circuit on the substrate, and a width of the fourth portion is greater than the width of the first portion, and the width of the fourth portion is greater than the width of the second portion.

By arranging the low-potential signal line as the first portion, the second portion, and the fourth portion, the signal can be transmitted to the display area through the connected first, second, fourth portions, so that the low-potential signal line operates normally, and the fourth portion is arranged in the light-shielding layer, and a projection of the fourth portion on the substrate overlaps a projection of the gate driving circuit on the substrate, thus reducing the width of the border occupied by the fourth portion. Since the fourth portion extends from the low-potential signal line area where the first portion and the second portion are located to the gate driving circuit area, the width of the fourth portion is relatively large, which reduces the impedance of the low-potential signal line, so that the impedance of the low-potential signal line meets the driving requirements and even reduces the impedance of the low-potential signal line, thereby reducing the widths of the first portion and the second portion, reducing the width of the border occupied by the low-potential signal line, and reducing the width of the border of the display panel. In addition, this setting method does not need to add a new layer, and thus does not increase the thickness of the display panel.

Specifically, when the fourth portion of the low-potential signal line is disposed in the light-shielding layer, in view of the problems that the distance between the light-shielding layer and the first source-drain layer is large and the metal is easily broken in the via hole, it is connected by other layers, for example, by the first metal layer, which is not particularly limited in this embodiment of the present application, as long as normal connection of low-potential signal lines can be achieved.

The above embodiments have been described in detail by taking the reset signal line and the low-potential signal line arranged in the light-shielding layer as an example. In this case, the reset signal line and the low-potential signal line only need to be insulated from each other, and the arrangement of the reset signal line and the low-potential signal line can be arranged as described in the above-mentioned embodiments, which will not be repeated herein for brevity.

Meanwhile, when a third source-drain layer is added, the reset signal line can also be arranged in the light-shielding layer, and the third portion of the low-potential signal line can be arranged in the third source-drain layer; or alternatively, the low-potential signal line is arranged in the light-shielding layer while disposing the reset signal line in the third source-drain layer, so that the width of the gate driving circuit area occupied by the low-potential signal lines is increased, the width of the border occupied by the low-potential signal lines is thereby reduced, and the width of the border of the display panel is further reduced.

Figure 4:
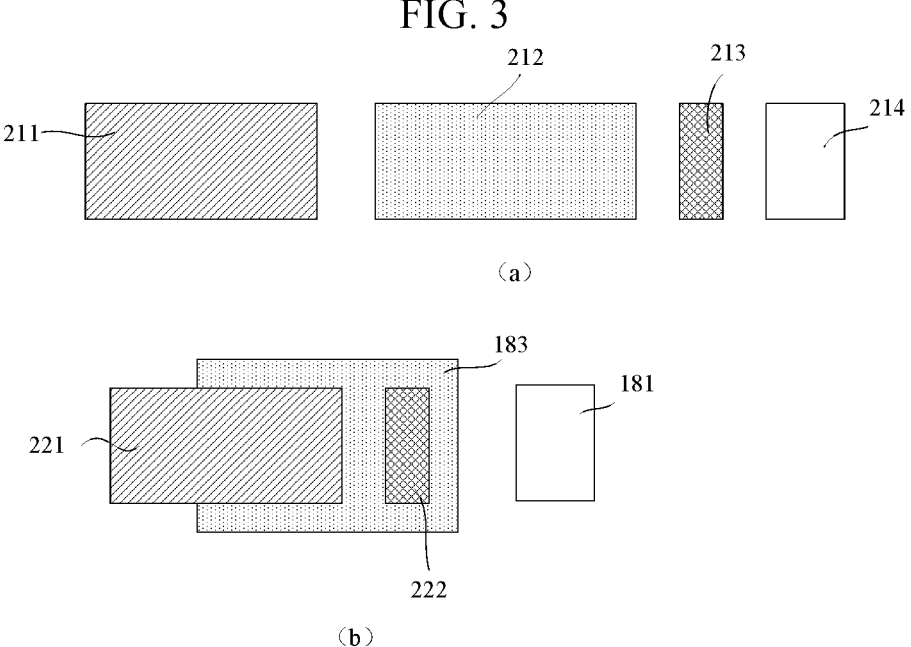
FIG. 4 is a comparison diagram between arrangement areas of components of the current display device and the display panel of the present application in an embodiment of the present application.

As shown in FIG. 4, FIG. 4(*a*) is a schematic diagram showing arrangement areas of components of the current display device, and FIG. 4(*b*) is a schematic diagram showing arrangement areas of parts of the display panel of the present application. As can be seen from FIG. 4(*a*), outside the display area 214, the gate driving circuit setting area 212, the low-potential signal line setting area 211, and the reset signal line setting area 213 need to be defined respectively, resulting in a relatively large border of the display device. In the present application, by arranging the low-potential signal line and the reset signal line in the gate driving circuit area, as shown in FIG. 4(*b*), it can be seen that the low-potential signal line setting area 221 overlaps the gate driving circuit area 183, the reset signal line setting area 222 is located in the gate driving circuit area 183, which reduces the border of the display panel.

As shown in FIG. 2, the pixel driving circuit includes a first transistor T1, a second transistor T2, a third transistor T3, a first reset transistor T4, a first light-emitting control transistor T5, a second light-emitting control transistor T6, a second reset transistor T7, a storage capacitor Cst, a boost capacitor Cboost, a high potential signal line ELVDD, a data line Data, a first scan line P Scan (n), a second scan line P Scan (n−1), a third scan line N Scan (n), a the fourth scan line N Scan (n−5), and a light-emitting control line EM.

P Scan(n) represents a scan line of a current level, P Scan (n−1) represents a scan line of a previous level, and the above scan lines are used to control the P-type transistor; and N Scan (n) represents a scan line of the current level, N Scan (n−5) represents a scan line of upper five levels, and these two scan lines are used to control the N-type transistors.

Working principle of the circuit is as follows: in the first stage, the first reset transistor T4 and the second reset transistor T7 are turned on, the gate of the first transistor T1 is reset by the reset signal output by the first reset signal line VI-G, and the pixel light-emitting unit LED is reset by the reset signal output by the second reset signal line VI-G NO; in the second stage, the second transistor T2 and the third transistor T3 are turned on, and the data signal input by the data line Data is written into the gate of the first transistor T1; and in the third stage, the first light-emitting control transistor T5 and the second light-emitting control transistor T6 are turned on, and the pixel light-emitting unit LED is driven to emit light.

The embodiment of the present application is described in detail by taking the circuit diagram in FIG. 2 as an example, but the embodiments of the present application are not particularly limited thereto. For example, a display panel using a 7T1C (7 transistors and one capacitor) circuit can also adopt the design of the present application.

In an embodiment, in order to improve the flexibility of the display panel and the ability of the display panel to block water and oxygen, as shown in FIG. 1, the substrate 11 includes a first flexible layer 111, a barrier layer 112, and a second flexible layer 113, and the display panel further includes a buffer layer 13.

In one embodiment, as shown in FIG. 1, the display panel further includes a first insulating layer 142, a second insulating layer 144, a third insulating layer 146, a fourth insulating layer 148, and a fifth insulating layer 150.

In one embodiment, as shown in FIG. 1, the semiconductor layer 141 includes a semiconductor pattern 141*a*.

In one embodiment, as shown in FIG. 1, the source 151*d* includes a first source portion 151*a* and a second source portion 151*c*.

In an embodiment, as shown in FIG. 1, the display panel further includes an active layer 147 and a third metal layer 149, wherein a material of the semiconductor layer is low temperature polysilicon, and a material of the active layer is oxide.

As shown in FIG. 1, in the embodiment of the present application, low temperature poly-oxide (LTPO) technology is taken as an example to describe the structure of the display panel, but embodiments of the present application are not particularly limited thereto. For example, the display panel may use the LTPS (low temperature poly-silicon) technology.

Specifically, for a perspective structure of the display panel shown in FIG. 1, the specific designs of the second source-drain layer to the third source-drain layer are described in detail. As shown in FIGS. 1, 2, 3, 4, 5, 6, and 7, in the non-display area, the second source-drain layer 153 is formed with the second source portion 151*c* of the source 151*d*, the second portion 162 of the low-potential signal line, and the connection metal. The connection metal is insulated from the second source portion 151*c* and the second portion 162 of the low-potential signal line, and the connection metal is not shown in the drawings. The second planarization layer 155 is formed with via holes in the connection metal and in the second portion 162 of the low-potential signal line, and the third source-drain layer 154 is formed with the reset signal line 171 and the third portion 163 of the low-potential signal line, the reset signal line is connected to the connection metal through the via hole of the second planarization layer 155, and then the connection metal extends to the display area and is connected to the electrodes of the first reset transistor and the second reset transistor. The third portion 163 of the low-potential signal line is connected to the second portion 162 of the low-potential signal line through the via hole of the second planarization layer 155.

Specifically, the display panel further includes a third planarization layer, a pixel electrode layer, a light-emitting material layer, a pixel definition layer, and a common electrode layer. The third planarization layer is disposed on a side of the third source-drain layer away from the second planarization layer. In the gate driving circuit area, the pixel electrode layer is formed with a connection metal, the common electrode layer is connected to the connection metal through the via hole of the pixel definition layer, and the connection metal is connected to the third portion of the low-potential signal line through the via hole of the third planarization layer.

Figure 5:
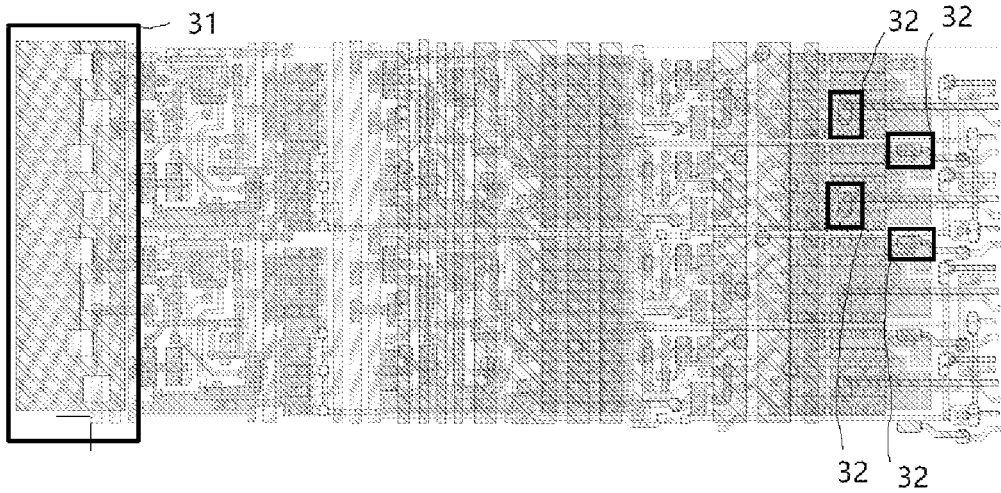
FIG. 5 is a first perspective view of the display panel provided by an embodiment of the present application.
Figure 6:
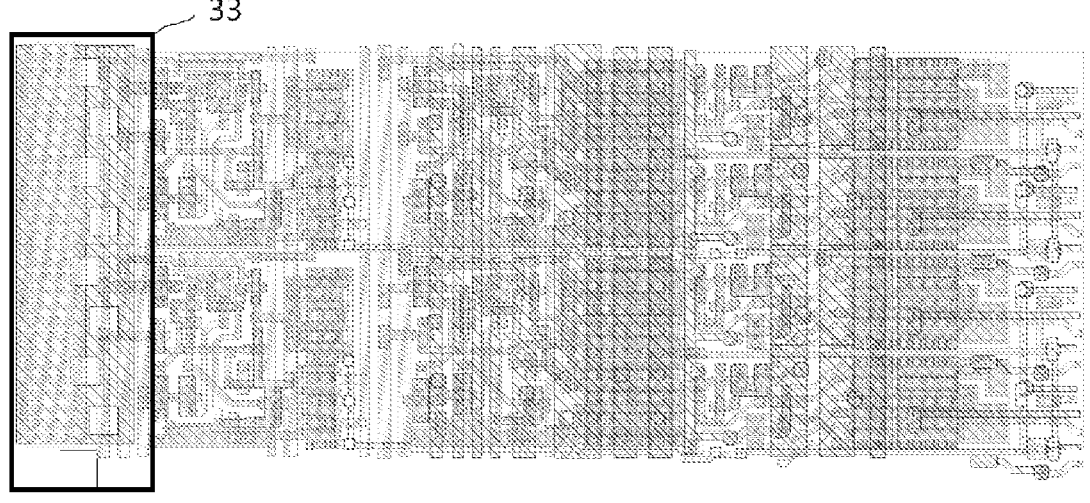
FIG. 6 is a second perspective view of the display panel provided by the embodiment of the present application.
Figure 7:
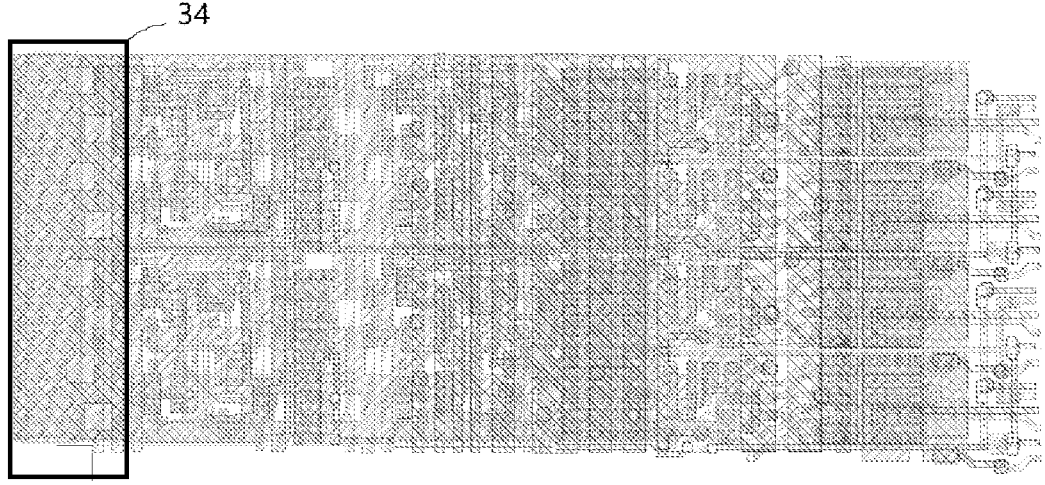
FIG. 7 is a third perspective view of the display panel provided by an embodiment of the present application.
Figure 8:
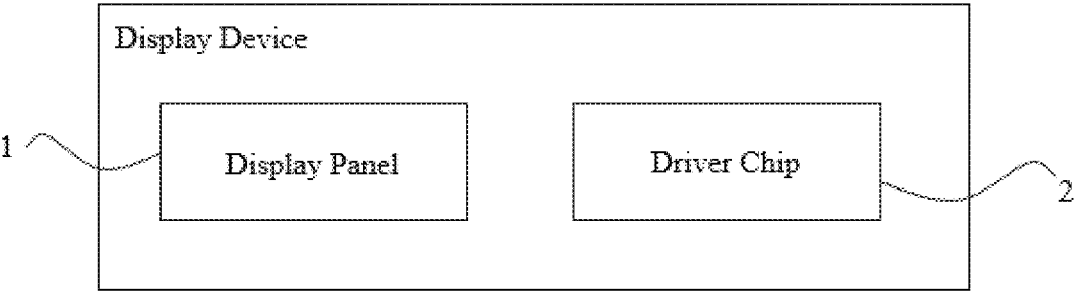
FIG. 8 is a schematic diagram of a display device according to an embodiment of the present application.

Specifically, FIG. 5 to FIG. 7 are perspective views of the gate driving circuit area and the low-potential signal line area of the display panel, wherein FIG. 5 is a perspective view of the display panel after the second source-drain layer are prepared, FIG. 6 is a perspective view of the display panel after the second planarization layer is prepared, and FIG. 7 is a schematic diagram of the display panel after the third source-drain layer are prepared.

Specifically, in FIG. 5, the reference numeral 31 indicates a connection position reserved for the low-potential signal line after the preparation of the second source-drain layer, and the reference numeral 32 indicates a connection position reserved for the reset signal line after the preparation of the second source-drain layer. In FIG. 6, the reference numeral 33 indicates a position of the connection hole of the low-potential signal line after the preparation of the second planarization layer. Meanwhile, the position of the connection hole of the reset signal line is arranged at the same position as the connection position reserved for the reset signal line in FIG. 5. In FIG. 7, the reference numeral 34 indicates a connection between the third portion of the low-potential signal line and the second portion of the low-potential signal line, and at the same time, the reset signal line is connected to the connection metal at the same position as the connection position reserved for the reset signal line in FIG. 5.

Meanwhile, an embodiment of the present application provides a display device, and the display device includes the display panel 1 and the driving chip 2 described in any one of the above-mentioned embodiments.

According to the above embodiments, it is appreciated that:

The present application provides a display panel and a display device; the display panel includes a display area and a non-display area, the display area is provided with a pixel light-emitting unit and a pixel driving circuit for controlling the pixel light-emitting unit, the non-display area is defined at a periphery of the display area, and the non-display area is defined at a periphery of the display area, wherein the non-display area includes a gate driving circuit area, and the non-display area is provided with a reset signal line and a low-potential signal line; wherein the reset signal line is connected to the pixel driving circuit, the low-potential signal line is connected to the pixel light-emitting unit, the gate driving circuit area is provided with a gate driving circuit, at least a part of at least one of the reset signal line and the low-potential signal line is disposed in the gate driving circuit area, and the reset signal line and the low-potential signal line are insulated from the gate driving circuit. In the present application, by disposing at least a part of at least one of the reset signal line and the low-potential signal line in the gate driving circuit area, an area of at least the part of the gate driving circuit area occupied by the reset signal line and the low-potential signal line can be reduced, so that a width of a border required for the part is reduced, thereby reducing the border of the display panel. In addition, this approach does not need to dispose the gate driving circuit on the light-emitting unit, thus reducing the technological difficulty of manufacturing the display panel, and improving the yield of the display panel.

In the above embodiments, the descriptions of each embodiment have their own emphasis. The parts that are not described in detail in an embodiment can be referred to the detailed descriptions in other embodiments above.

The display panel and the display device provided in the embodiments of the present application have been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A display panel, comprising:

a display area provided with a pixel light-emitting unit and a pixel driving circuit configured to control the pixel light-emitting unit;

a non-display area defined at a periphery of the display area, wherein the non-display area comprises a gate driving circuit area, and the non-display area is provided with a reset signal line and a low-potential signal line;

wherein the reset signal line is connected to the pixel driving circuit, the low-potential signal line is connected to the pixel light-emitting unit, the gate driving circuit area is provided with a gate driving circuit, at least a part of at least one of the reset signal line and the low-potential signal line is disposed in the gate driving circuit area, and the reset signal line and the low-potential signal line are insulated from the gate driving circuit;

wherein the display panel comprises:

a substrate;

a semiconductor layer disposed on a side of the substrate;

a first metal layer disposed on a side of the semiconductor layer away from the substrate;

a second metal layer disposed on a side of the first metal layer away from the semiconductor layer;

a first source-drain layer disposed on a side of the second metal layer away from the first metal layer; and a second source-drain layer disposed on a side of the first source-drain layer away from the second metal layer;

wherein, the gate driving circuit comprises a transistor and a capacitor, the transistor comprises a gate, a source, and a drain, the capacitor comprises a capacitor plate, the gate is disposed in the first metal layer, and the capacitor plate is disposed in the second metal layer, the source and the drain are disposed in the first source-drain layer, and at least part of the reset signal line and the low-potential signal line is disposed in a different layer from a metal located in the first metal layer, the second metal layer, the first source-drain layer, and the second source-drain layer in the gate driving circuit.

2. The display panel according to claim 1, wherein the display panel further comprises a third source-drain layer, a first planarization layer, and a second planarization layer, the third source-drain layer is disposed on a side of the second source-drain layer away from the first source-drain layer, the first planarization layer is disposed between the first source-drain layer and the second source-drain layer, the second planarization layer is disposed between the second source-drain layer and the third source-drain layer; at least one of the reset signal line and the low-potential signal line comprises a first overlapping portion disposed in the third source-drain layer, and a projection of the first overlapping portion on the substrate overlaps a projection of the gate driving circuit on the substrate.

3. The display panel according to claim 2, wherein the reset signal line is disposed in the third source-drain layer, and a projection of the reset signal line on the substrate overlaps the projection of the gate driving circuit on the substrate.

4. The display panel according to claim 3, wherein the projection of the reset signal line on the substrate overlaps a projection of the source on the substrate, or the projection of the reset signal line on the substrate overlaps a projection of the drain on the substrate, or the projection of the reset signal line on the substrate overlaps a projection of the gate on the substrate, or the projection of the reset signal line on the substrate overlaps a projection of the capacitor plate on the substrate.

5. The display panel according to claim 2, wherein the low-potential signal line is disposed in the third source-drain layer, and a projection of the low-potential signal line on the substrate overlaps the projection of the gate driving circuit on the substrate.

6. The display panel according to claim 5, wherein the low-potential signal line comprises a first portion, a second portion and a third portion, the first portion is disposed in the first source-drain layer, the second portion is disposed in the second source-drain layer, the third portion is disposed in the third source-drain layer, and the second portion is connected to the first portion through a via hole penetrating through the first planarization layer, the third portion is connected to the second portion through the via hole penetrating through the second planarization layer, a projection of the third portion on the substrate overlaps the projection of the gate driving circuit on the substrate, a width of the third portion is greater than a width of the first portion, and the width of the third portion is greater than a width of the second portion.

7. The display panel according to claim 1, wherein the display panel further comprises a light-shielding layer disposed between the substrate and the semiconductor layer, at least one of the reset signal line and the low-potential signal line comprises a second overlapping portion disposed in the light-shielding layer, and a projection of the second overlapping portion on the substrate overlaps the projection of the gate driving circuit on the substrate.

8. The display panel according to claim 7, wherein the reset signal line is disposed in the light-shielding layer, and the projection of the reset signal line on the substrate overlaps the projection of the gate driving circuit on the substrate.

9. The display panel according to claim 7, wherein the display panel further comprises a first insulating layer, a second insulating layer, a third insulating layer, a fourth insulating layer, a fifth insulating layer, an active layer, and a third metal layer, and the first insulating layer is disposed between the semiconductor layer and the first metal layer, the second insulating layer is disposed between the first metal layer and the second metal layer, the third insulating layer is disposed between the second metal layer and the active layer, the fourth insulating layer is disposed between the active layer and the third metal layer, and the fifth insulating layer is disposed between the third metal layer and the first source-drain layer.

10. A display device, comprising a display panel and a driver chip, the display panel comprising:

a display area provided with a pixel light-emitting unit and a pixel driving circuit configured to control the pixel light-emitting unit;

a non-display area defined at a periphery of the display area, wherein the non-display area comprises a gate driving circuit area, and the non-display area is provided with a reset signal line and a low-potential signal line;

wherein the reset signal line is connected to the pixel driving circuit, the low-potential signal line is connected to the pixel light-emitting unit, the gate driving circuit area is provided with a gate driving circuit, at least a part of at least one of the reset signal line and the low-potential signal line is disposed in the gate driving circuit area, and the reset signal line and the low-potential signal line are insulated from the gate driving circuit;

wherein the display panel comprises:

a substrate;

a semiconductor layer disposed on a side of the substrate;

a first metal layer disposed on a side of the semiconductor layer away from the substrate;

a second metal layer disposed on a side of the first metal layer away from the semiconductor layer;

a first source-drain layer disposed on a side of the second metal layer away from the first metal layer; and a second source-drain layer disposed on a side of the first source-drain layer away from the second metal layer;

wherein, the gate driving circuit comprises a transistor and a capacitor, the transistor comprises a gate, a source, and a drain, the capacitor comprises a capacitor plate, the gate is disposed in the first metal layer, and the capacitor plate is disposed in the second metal layer, the source and the drain are disposed in the first source-drain layer, and at least part of the reset signal line and the low-potential signal line is disposed in a different layer from a metal located in the first metal layer, the second metal layer, the first source-drain layer, and the second source-drain layer in the gate driving circuit.

11. The display device according to claim 10, wherein the display panel further comprises a third source-drain layer, a first planarization layer, and a second planarization layer, the third source-drain layer is disposed on a side of the second source-drain layer away from the first source-drain layer, the first planarization layer is disposed between the first source-drain layer and the second source-drain layer, the second planarization layer is disposed between the second source-drain layer and the third source-drain layer; at least one of the reset signal line and the low-potential signal line comprises a first overlapping portion disposed in the third source-drain layer, and a projection of the first overlapping portion on the substrate overlaps a projection of the gate driving circuit on the substrate.

12. The display device according to claim 11, wherein the reset signal line is disposed in the third source-drain layer, and a projection of the reset signal line on the substrate overlaps the projection of the gate driving circuit on the substrate.

13. The display device according to claim 12, wherein the projection of the reset signal line on the substrate overlaps a projection of the source on the substrate, or the projection of the reset signal line on the substrate overlaps a projection of the drain on the substrate, or the projection of the reset signal line on the substrate overlaps a projection of the gate on the substrate, or the projection of the reset signal line on the substrate overlaps a projection of the capacitor plate on the substrate.

* * * * *